(12) United States Patent
Smith et al.

(10) Patent No.: US 8,635,569 B2
(45) Date of Patent: Jan. 21, 2014

(54) APPARATUS AND METHOD OF GENERATING UNIVERSAL MEMORY I/O

(75) Inventors: Sterling Smith, Hsinchu Hsien (TW);
Hsian-Feng Liu, Hsinchu Hsien (TW);
Eer-Wen Tyan, Hsinchu Hsien (TW);
Chun-Chia Chen, Hsinchu Hsien (TW);
Ming-Chieh Yeh, Hsinchu Hsien (TW);
Chung-Ching Chen, Hsinchu Hsien (TW); Yo-Lin Chen, Hsinchu Hsien (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 257 days.

(21) Appl. No.: 12/947,966

(22) Filed: Nov. 17, 2010

(65) Prior Publication Data

US 2011/0131354 A1 Jun. 2, 2011

(30) Foreign Application Priority Data

Dec. 2, 2009 (TW) ................................ 98141159 A

(51) Int. Cl.
*G06F 17/50* (2006.01)

(52) U.S. Cl.
USPC ........... 716/116; 716/100; 716/101; 716/102; 716/103; 716/104; 716/110; 716/117; 710/10; 710/12; 710/63; 710/72; 710/104

(58) Field of Classification Search
None
See application file for complete search history.

(56) References Cited

U.S. PATENT DOCUMENTS

| | | | |
|---|---|---|---|
| 6,051,031 A * | 4/2000 | Shubat et al. | 326/40 |
| 6,941,538 B2 * | 9/2005 | Hwang et al. | 716/102 |
| 7,065,734 B2 * | 6/2006 | Dalton | 716/104 |
| 7,362,135 B1 * | 4/2008 | Chang | 326/47 |
| 7,398,492 B2 * | 7/2008 | Youngman et al. | 716/102 |
| 7,404,156 B2 * | 7/2008 | Youngman et al. | 716/102 |
| 7,596,775 B2 * | 9/2009 | Tsien et al. | 716/102 |
| 7,661,010 B2 * | 2/2010 | DeFazio et al. | 713/500 |
| 7,945,878 B2 * | 5/2011 | Youngman et al. | 716/104 |
| 8,407,643 B1 * | 3/2013 | Atsatt | 716/117 |
| 2003/0163798 A1 * | 8/2003 | Hwang et al. | 716/16 |
| 2005/0251772 A1 * | 11/2005 | Youngman et al. | 716/6 |
| 2005/0273736 A1 * | 12/2005 | Youngman et al. | 716/4 |
| 2005/0273737 A1 * | 12/2005 | Youngman et al. | 716/4 |
| 2008/0263480 A1 * | 10/2008 | Youngman et al. | 716/1 |

* cited by examiner

*Primary Examiner* — Steven Snyder
(74) *Attorney, Agent, or Firm* — Edell, Shapiro & Finnan, LLC

(57) ABSTRACT

A universal memory I/O generating apparatus includes a defining module, a retrieving module, a generating module, and a layout module. The defining module defines a mapping table according to a pin configuration of a plurality of I/Os. The mapping table includes corresponding relationships between the plurality of IOs and a plurality of memory functions. The retrieving module retrieves control information corresponding to the mapping table from candidate information, which is associated with the corresponding relationships between the plurality of I/Os and the plurality of memory functions. The generating module generates a hardware description language (HDL) file according to the control information. The layout module programs the plurality of I/Os according to the HDL file, so that each of the I/Os can correspond to its corresponding memory function.

12 Claims, 2 Drawing Sheets

APPARATUS AND METHOD OF GENERATING UNIVERSAL MEMORY I/O

CROSS REFERENCE TO RELATED PATENT APPLICATION

This patent application is based on Taiwan, R.O.C. patent application No. 098141159 filed on Dec. 2, 2009.

FIELD OF THE INVENTION

The present invention relates to an I/O of a memory, and more particularly, to an apparatus and method of generating universal I/O, which are capable of automatically corresponding to various functions of different memory types to meet their requirements.

BACKGROUND OF THE INVENTION

Accompanied with the development of realtime applications of information processing devices, such as audio/video realtime playback, video retrieving and recording of multimedia applications, and continual upgrading of CPUs, data transmission rates of memory devices for the information processing devices are increasingly getting higher as well.

In a conventional synchronous dynamic random access memory (SDRAM), one of reading and writing is allowed at a rising edge of every square wave within a clock cycle. When writing and reading are simultaneously requested, one of them is performed after the other is completed. To overcome such shortcoming, a double-data-rate (DDR) SDRAM is designed to provide reading and writing respectively at a rising and a falling edge of every square wave within on clock cycle, so that the data transmission rate of the DDR SDRAM is double. Moreover, DDR2 SDRAM and DDR3 SDRAM, successive to the DDR SDRAM, provide even higher performance and lower voltage, and are capable of increasing the data transmission rate to four and eight times that of the original SDRAM.

To enhance power-saving and transmission rate, the new-generation DDR2 SDRAM and DDR3 SDRAM have different packages and I/O arrangements from the conventional DDR SDRAM, and add numerous memory functions. For example, the DDR2 SDRAM is provided with ODT (On-Die Termination), OCD (Off-Chip Driver), posted CAS (Column Address Strobe) and AL (Additive Latency) controls; the DDR3 SDRAM is further provided with CWD (Column Write Delay), Reset, ZQ (zero-quotient) calibration, SRT (Self-Reflash Temperature) and PASR (Partial Array Self-Refresh) functions.

In practice, an electronic device may adopt different types of SDRAM based on its actual requirements. For example, the faster DDR3 SDRAM may be used in high-end electronic devices that require a higher memory data transmission rate; the slower DDR SDRAM may be used in low-end electronic devices that require a lower memory data transmission rate. However, because the I/O interfaces and configurations of the DDR SDRAM, DDR2 SDRAM and DDR3 SDRAM are different, different designs corresponding to the DDR SDRAM, DDR2 SDRAM and DDR3 SDRAM are needed. That is to say, in the prior art, I/Os of a chip are only compatible with one of DDR SDRAM, DDR2 SDRAM and DDR3 SDRAM.

Further, it is to be noted that different types of SDRAM (e.g., DDR SDRAM, DDR2 SDRAM, and DDR3 SDRAM) have different electrical characteristics and speed requirements for a same memory function (e.g., data strobe, data address, clock). Hence, to fulfill different requirements of different types of SDRAM when incorporating DDR SDRAM, DDR2 SDRAM and DDR3 SDRAM into chip designs, much time and effort is needed to tune the electrical characteristics and speeds to ideal values, thereby resulting in a time-consuming and lengthy design flow.

Therefore, there is a need for a universal I/O generating apparatus and method for overcoming the above issues.

SUMMARY OF THE INVENTION

An apparatus for generating universal I/Os is provided according to an embodiment of the present disclosure. In this embodiment, the apparatus for generating universal I/Os comprises a defining module, a retrieving module, a generating module and a layout module. The defining module defines a lookup table for a plurality of I/Os, and the lookup table records relationships between the I/Os and a plurality of memory functions. The retrieving module, coupled to the defining module, retrieves control information for a memory type from a plurality of candidate control information according to the lookup table, wherein the control information comprises a configuration of the I/Os. The generating module, coupled to the retrieving module, for generating a hardware description language (HDL) file according to the control information. The layout module, coupled to the generating module, for programming the I/Os according to the HDL file.

A method for generating universal I/Os is provided according to another embodiment of the invention. In this embodiment, the method for generating universal I/Os comprises: defining a lookup table for a plurality of I/Os, the lookup table records relationships between the I/Os and a plurality of memory functions; retrieving a control information for a memory type from a plurality of candidate control information according to the lookup table, wherein the control information comprises a configuration of the I/Os; generating a hardware description language (HDL) file according to the control information; and programming the I/Os according to the HDL file.

Compared to the prior art, whether an electronic device adopts the DDR SDRAM, DDR2 SDRAM or DDR3 SDRAM, the apparatus and method for generating universal I/Os of the present disclosure are capable automatically allotting corresponding memory functions to each of the I/Os according to an arrangement of the I/Os, so that the memory functions corresponding to the different pins respectively satisfy requirements of electrical characteristics and operating speeds of different DDR types. Thus, regardless of the type of SDRAM that an electronic device adopts, the apparatus and method for generating universal I/Os of the present disclosure are capable of defining the universal I/Os in a way that the universal I/Os are adaptive to the SDRAM adopted.

Therefore, in the process of chip designing, chips with different designs corresponding to specifications of the DDR SDRAM, DDR2 SDRAM and DDR3 SDRAM are no longer needed. Instead, through the apparatus and method for generating universal I/Os of the present disclosure, the universal I/Os of a same chip are design correspond to the type of SDRAM adopted to significantly reduce the amount of time of chip designing.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF THE PREFERRED EMBODIMENT

Figure 1:
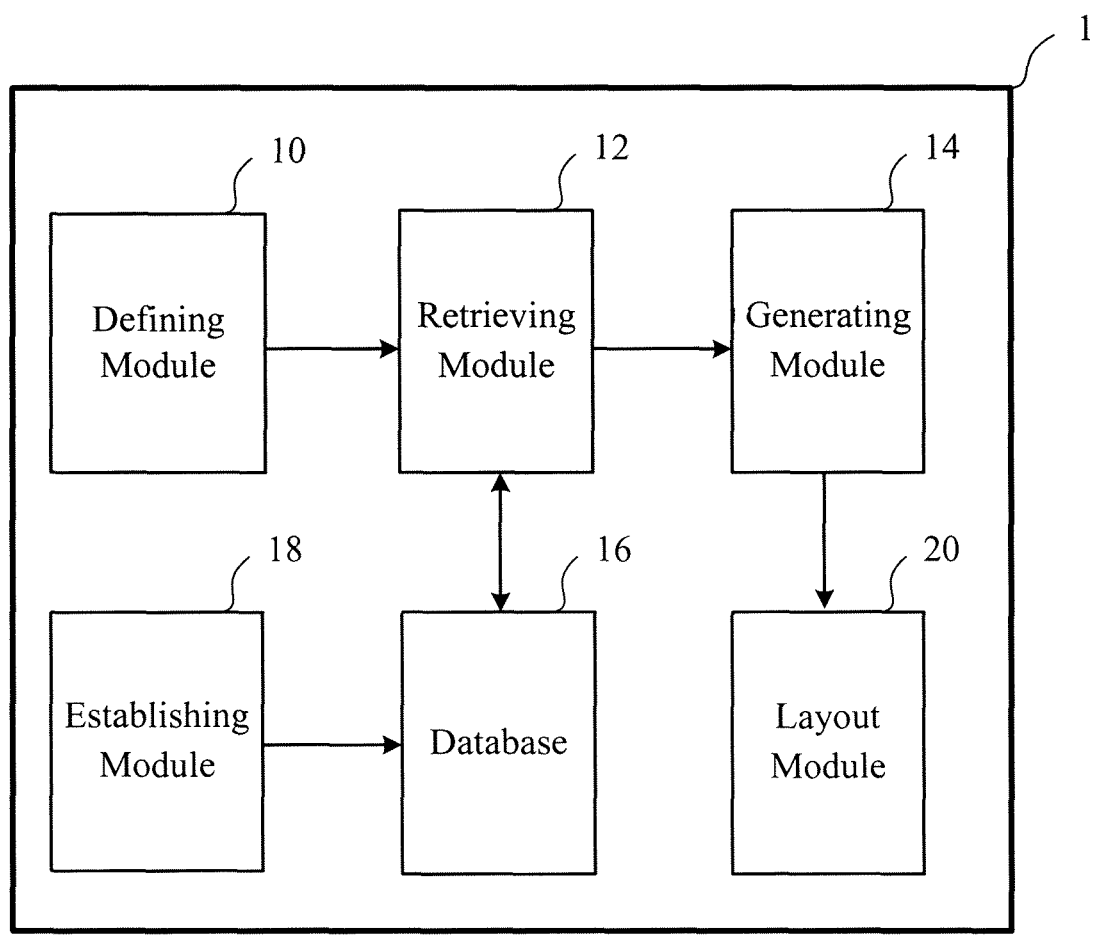
FIG. 1 is a block diagram of a universal memory I/O generating apparatus according to a first embodiment of the invention.

The objective of the invention is to provide an apparatus and method for generating universal memory I/Os. FIG. 1 shows a block diagram of a universal memory I/O generating apparatus according to a first embodiment of the disclosure. As shown in FIG. 1, the universal memory I/O generating apparatus 1 comprises a defining module 10, a retrieving module 12, a generating module 14, and a database 16, an establishing module 18 and a layout module 20. The defining module 10 is coupled to the retrieving module 12; the retrieving module 12 is coupled to the generating module 14 and the database 16; the generating module 14 is coupled to the layout module 20; and the establishing module 18 is coupled to the database 16—details of the above modules shall be described below.

In this embodiment, the establishing module 18 establishes a plurality of candidate control information and stores the candidate control information into the database 16. For example, the candidate control information comprises a plurality of software and register settings corresponding to various memory functions (e.g., CLK, ADD and CMD) of different memory types (e.g., DDR SDRAM, DDR2 SDRAM and DDR3 SDRAM). The control information is used to configure the I/Os for a specific memory type. The I/Os have different configurations for different memory types. According to the present disclosure, the software and register settings are used for programming a plurality of I/Os corresponding to the memory functions of an electronic device, so that the I/Os can perform the corresponding memory functions. Further, apart from the memory I/Os, the electronic device may also include other I/Os.

In this embodiment, the defining module 10 defines a lookup table according to a pin assignment associated with the I/Os of the memory functions. The lookup table records the relationships between I/Os and memory functions.

TABLE 1

| I/O pin no. | DDR SDRAM | DDR2 SDRAM | DDR3 SDRAM |
| --- | --- | --- | --- |
| IO10 | CLK | ADD | CLK |
| IO11 | DQS | CLK | DQ |
| IO12 | DQ | ADD | DQS |
| IO13 | ADD | DQS | CWD |
| IO14 | DQS | DQ | ZQ |
| IO15 | DQ | ADD | |
| IO16 | ADD | CLK | SRT |
| IO17 | ADD | ADD | ADD |
| IO18 | | CMD | ADD |
| IO19 | CMD | | CMD |

Table-1 shows an example of a lookup table defined by the defining module 10. Suppose the electronic device has 64 I/O pins, respectively numbered as pins IO0 to IO63. Table-1 shows ten I/O pins IO10 to IO19 corresponding to different types of DDR SDRAM. The memory functions and their respectively positions at the I/O pins IO10 to IO19 are used merely as an example, and shall not be construed as limiting the invention. Based on actual requirements, I/Os of the DDR SDRAM memory are often arranged as neighboring pins, but at times may be scattered at different parts of a chip. Further, certain I/Os correspond to only certain but not all DDR SDRAM types. For example, pin IO15 only corresponds to DQ of DDR SDRAM and ADD of DDR2 SDRAM.

For example, suppose an electronic device adopts DDR2 or DDR3 SDRAM for a higher memory data transmission rate. As shown in Table-1, the I/Os pins IO10 to IO19 of the electronic device are set to different memory functions respectively corresponding to DDR2 and DDR3 SDRAM.

Taking pin IO10 for example, pin IO10 is used for the ADD function when applied to DDR2 SDRAM and is used for the CLK function when applied to DDR3 SDRAM. Electrical characteristics and speeds of ADD of DDR2 SDRAM and CLK of DDR3 SDRAM are known values, and thus the universal memory I/O generating apparatus 1 sets the configuration of pin IO10 according to the known specifications, so that the pin IO10 respectively satisfies electrical characteristics and speeds for both ADD function of DDR2 SDRAM and CLK function of DDR3 SDRAM.

Taking pin IO17 for another example, pin IO17 is used for the same ADD function no matter applied to DDR2 SDRAM or DDR3 SDRAM. Although pin IO17 is used for the same memory function, electrical characteristics and speeds of the ADD function with respect to DDR2 SDRAM and DDR3 SDRAM are different as described. Therefore, the universal memory I/O generating apparatus 1 nevertheless needs to set the pin IO17 according to the known specifications, so that the pin IO17 respectively satisfies electrical characteristics and speeds for the ADD function used in DDR2 SDRAM and DDR3 SDRAM.

In practice, packages of the chip with DDR, DDR2, and DDR3 SDRAM are selected according to actual needs, and can be, for example, ball grid array (BGA), or other packages.

Through the universal memory I/O generating apparatus 1 of the present disclosure, an I/O of an electronic device is not restrictedly allotted to a certain memory function but can be adaptively allotted to different memory functions of different memory types to effectively increase flexibility of circuit design. More importantly, regardless of the type of DDR SDRAM that an electronic device adopts, the universal memory I/O generating apparatus 1 is capable of defining universal I/Os in a same chip to accommodate the adopted SDRAM type instead of having to provide different chips that individually correspond to DDR, DDR2 and DDR3 SDRAM.

In this embodiment, the retrieving module 12 of the universal memory I/O generating apparatus 1 retrieves from candidate control information corresponding to the lookup table. The generating module 14, according to the control information, generates a hardware description language (HDL) file, an automatic placement and routing (APR) rule and a coordinate. For example, the HDL file is a verilog description file.

The layout module 20 then performs APR on the I/Os according to the APR rule and the coordinate to generate a circuit layout, and programs the I/Os according to the HDL file so that the I/Os correspond to respective memory functions.

For example, the layout module 20 may further add a locked loop to the circuit before completing the entire APR procedure. For example, the locked loop is a delay locked loop or a phase locked loop.

Figure 2:
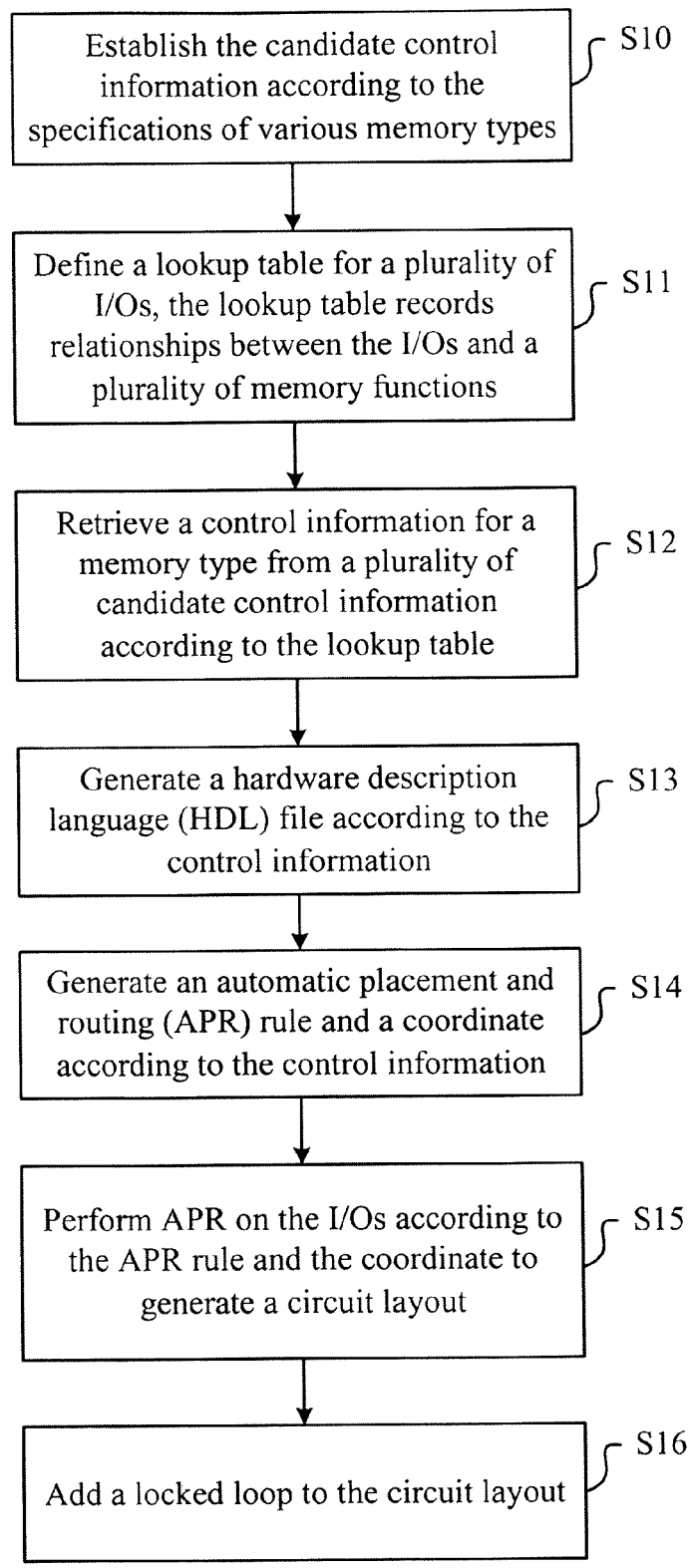
FIG. 2 is a flowchart of a universal memory I/O generating method according to a first embodiment of the invention.

A universal memory I/O generating method is provided according to a second embodiment of the present disclosure. FIG. 2 shows a flowchart of the universal memory I/O generating method. In Step S10, candidate control information is established and stored in a database. For example, the candidate control information comprises software and register settings of various memory functions (e.g., CLK, ADD and CMD) corresponding to different memory types (e.g., DDR SDRAM, DDR2 SDRAM and DDR3 SDRAM). According to the present disclosure, the software and register settings are for programming a plurality of I/Os corresponding to the DDR memory functions of an electronic device, so that the I/Os can perform the corresponding memory functions.

In Step S11, a lookup table is defined according to a pin assignment of the I/Os of the electronic device. The lookup table records relationships between the I/Os and a plurality of memory functions. Other related details are as described in the first embodiment and shall not be again given for brevity.

In Step S12, a control information corresponding to the lookup table is retrieved from the candidate control information stored in the database. In Step 13, an HDL file, e.g., a verilog file, is generated according to the control information. For example, supposing an I/O pin IO2 of an electronic apparatus corresponds to a CWD function of the DDR3 SDRAM, the control information of the CWD function of the DDR3 SDRAM is retrieved from candidate control information from the database, and the I/O pin IO2 of the electronic device is programmed according the HDL file, so that the I/O pin IO2 not only automatically corresponds to the CWD function but also satisfies electrical characteristic and speed of the CWD function of the DDR3 SDRAM.

In practice, the method may proceed to Step 14, in which an APR rule and a coordinate are generated according to the control information. In Step S15, an APR procedure is performed on the I/Os according to the APR rule and the coordinate to generate a circuit layout. In Step S16, a locked loop, e.g., a delay locked loop or a phase locked loop, is added to the circuit layout to complete the entire APR procedure.

Thus, regardless of the type of SDRAM that an electronic device adopts, the apparatus and method for generating universal I/Os of the present disclosure are capable of automatically allotting corresponding memory functions to each of the I/Os according to the pin assignment of the I/Os, so that the memory functions corresponding to the different pins respectively satisfy requirements of electrical characteristics and operating speeds of different DDR types. Thus, regardless of the type of SDRAM that an electronic device adopts, the apparatus and method for generating universal I/Os of the present disclosure are capable of defining the universal I/Os in a way that the universal I/Os are adaptive to the SDRAM adopted.

Therefore, in the process of chip designing, chips with different designs corresponding to specifications of the DDR SDRAM, DDR2 SDRAM and DDR3 SDRAM are no longer needed. Instead, through the apparatus and method for generating universal I/Os of the present disclosure, the universal I/Os of a same chip are designed correspondingly to the type of SDRAM adopted to significantly reduce the amount of time of chip designing, so that an overall cost of the chip is noticeably reduced to increase market competitiveness.

While the invention has been described in terms of what is presently considered to be the most practical and preferred embodiments, it is to be understood that the invention needs not to be limited to the above embodiments. On the contrary, it is intended to cover various modifications and similar arrangements included within the spirit and scope of the appended claims which are to be accorded with the broadest interpretation so as to encompass all such modifications and similar structures.

What is claimed is:

1. A universal memory I/O generating apparatus, comprising:
    a defining module, for defining a lookup table for a plurality of I/Os, the lookup table records a plurality of functions for all of the I/Os for different memory types;
    an establishing module, for establishing a plurality of candidate control information corresponding to the plurality of functions, wherein each of the plurality of candidate control information at least comprises a register setting;
    a database, coupled to the establishing module, for storing the plurality of candidate control information;
    a retrieving module, coupled to the defining module and the database, for retrieving a plurality of control information from the database for a selected memory type according to the functions of the I/Os of the selected memory type recorded in the lookup table;
    a generating module, coupled to the retrieving module, for generating a hardware description language (HDL) file according to the plurality of control information; and
    a layout module, coupled to the generating module, for programming the I/Os according to the HDL file.

2. The universal memory I/O generating apparatus as claimed in claim 1, wherein the memory types comprise double-data-rate (DDR) synchronous dynamic random access memory (SDRAM), DDR2 SDRAM, and DDR3 SDRAM.

3. The universal memory I/O generating apparatus as claimed in claim 1, wherein an I/O of the I/Os is configured to one of a first memory function for a first memory type and a second memory function for a second memory type.

4. The universal memory I/O generating apparatus as claimed in claim 1, wherein the generating module further generates an automatic placement and routing (APR) rule and a coordinate according to the control information.

5. The universal memory I/O generating apparatus as claimed in claim 4, wherein the layout module further performs APR on the I/Os according to the APR rule and the coordinate to generate a circuit layout.

6. The universal memory I/O generating apparatus as claimed in claim 5, wherein the layout module further adds a locked loop to the circuit layout.

7. A universal memory I/O generating method, comprising:
    defining a lookup table for a plurality of I/Os, the lookup table records a plurality of functions for all of the I/Os for different memory types;
    establishing a plurality of candidate control information corresponding to the plurality of functions, wherein each of the plurality of candidate control information at least comprises a register setting;
    storing the plurality of candidate control information in a database;
    retrieving, from the database, a plurality of control information for a selected memory type according to the functions of the I/Os of the selected memory type recorded in the lookup table;
    generating a hardware description language (HDL) file according to the plurality of control information; and
    programming the I/Os according to the HDL file.

8. The universal memory I/O generating method as claimed in claim 7, wherein the memory types comprise double-data-rate (DDR) synchronous dynamic random access memory (SDRAM), DDR2 SDRAM, and DDR3 SDRAM.

9. The universal memory I/O generating method as claimed in claim 7, wherein an I/O of the I/Os is configured to one of a first memory function for a first memory type and a second memory function for a second memory type.

10. The universal memory I/O generating method as claimed in claim 7, further comprising:
    generating an automatic placement and routing (APR) rule and a coordinate according to the control information.

11. The universal memory I/O generating method as claimed in claim 10, further comprising:

performing APR on the I/Os according to the APR rule and the coordinate to generate a circuit layout.

12. The universal memory I/O generating method as claimed in claim 11, further comprising:

adding a locked loop to the circuit layout.

\* \* \* \* \*